(12) United States Patent
Finkelstein et al.

(10) Patent No.: US 7,395,488 B2
(45) Date of Patent: Jul. 1, 2008

(54) SYSTEM AND METHOD FOR EFFICIENT USE OF MEMORY DEVICE BANDWIDTH

(75) Inventors: Jacob Moshe Finkelstein, Kfar-Saba (IL); Rakefet Kol, Haifa (IL); Asa Levinger, Haifa (IL)

(73) Assignee: Zoran Corporation, Sunnyvale, CA (US)

( * ) Notice: Subject to any disclaimer, the term of this patent is extended or adjusted under 35 U.S.C. 154(b) by 546 days.

(21) Appl. No.: 11/026,319

(22) Filed: Dec. 29, 2004

(65) Prior Publication Data
US 2006/0156190 A1     Jul. 13, 2006

(51) Int. Cl.
*G11C 29/00* (2006.01)
(52) U.S. Cl. ...................................... 714/763
(58) Field of Classification Search ................ 714/755, 714/763, 746
See application file for complete search history.

(56) References Cited

U.S. PATENT DOCUMENTS

| | | | | |
|---|---|---|---|---|
| 5,276,902 | A | * | 1/1994 | Nakatani et al. ............... 712/6 |
| 5,568,423 | A | | 10/1996 | Jou et al. ............... 365/185.33 |
| 6,003,151 | A | | 12/1999 | Chuang ....................... 714/752 |
| 6,158,038 | A | * | 12/2000 | Yamawaki et al. .......... 714/755 |
| 6,223,322 | B1 | | 4/2001 | Michigami et al. .......... 714/769 |
| 6,317,855 | B1 | | 11/2001 | Horibe ........................ 714/752 |
| 6,564,304 | B1 | | 5/2003 | Van Hook et al. ............ 711/154 |
| 6,751,771 | B2 | | 6/2004 | Chuang et al. ............... 714/784 |
| 2002/0191967 | A1 | | 12/2002 | Freissmann et al. ......... 714/763 |

FOREIGN PATENT DOCUMENTS

JP          09091098          4/1997

OTHER PUBLICATIONS

4i2I Communications Ltd, "Reed-Solomon Codes," http://www.4i2i.com/reed_solomon_codes.htm, Oct. 29, 2004.
International Search Report for International Application No. PCT/US2005/047259, mailed Feb. 6, 2007.

* cited by examiner

*Primary Examiner*—Shelly Chase
(74) *Attorney, Agent, or Firm*—Morgan, Lewis & Bockius LLP

(57) ABSTRACT

In a device that utilizes a memory device, the access bandwidth of the memory device is efficiently utilized by determining a set of operations to be performed on information stored in the memory device, and sorting the operations into an order so as to minimize the number of accesses to the memory device to perform the operations. The sorted operations are then performed in that order. An example of such a device is an error correction decoder, such as for use with an optical disk reader or player. The error correction decoder generates error correction data, representing error correction operations, and sorts the error correction data into multiple sets, each set for correcting the errors in a respective row of an ECC block stored in an external buffer. The error correction operations are then performed row by row.

35 Claims, 18 Drawing Sheets

After correcting row 1 ...

| Parity Buffer 1 (192 x 10 + 16 x 182 = 4832 bytes) |
|---|
| Parity Buffer 2 (192 x 10 + 16 x 182 = 4832 bytes) |
| Unused Memory Space (~ 5Kb) |

SYSTEM AND METHOD FOR EFFICIENT USE OF MEMORY DEVICE BANDWIDTH

FIELD OF THE INVENTION

The present invention relates generally to systems and methods for making efficient use of the access bandwidth of a memory device, one example of which is a buffer memory used by an error correction decoder.

BACKGROUND OF THE INVENTION

Conventional error correction techniques in an optical disk system, e.g., a DVD system, often consume too much bandwidth of a memory device in order to correct errors identified in a data block. On the other hand, in order to reduce the system's manufacturing cost, the memory often needs to play more than one role simultaneously, e.g., video buffer and screen display buffer, each demanding a certain amount of bandwidth. As a result, there may be insufficient bandwidth resources left for performing all the error corrections required to correct a corrupted, but correctable data block. Even though it is possible to solve this problem by having an error correction decoder with a large on chip (built-in) memory, this solution inevitably drives up the cost of the optical disk system. Therefore, it is desirable to develop a new strategy that reduces the bandwidth requirement of error correction without significantly increasing the system's cost.

SUMMARY

In a device that utilizes a memory device, such as an SRAM, DRAM or any other suitable type of memory device, as a data buffer, the access bandwidth of the memory device is efficiently utilized by determining a set of operations to be performed on information stored in the memory device, and sorting the operations so as to minimize the number of accesses to the memory device to perform the operations. The sorted operations are then performed in the sorted order.

An example of such a device is an error correction decoder, such as for use with an optical disk reader or player. The error correction decoder generates error correction data, representing error correction operations, and sorts the error correction data into multiple sets, each set for correcting the errors in a respective row of an ECC block stored in an external buffer. The error correction operations are then performed row by row, in the same order as the sorted error correction data.

In one embodiment, a plurality of syndromes are computed for a data block (e.g., a data block read from an optical disk) and then error correction data for errors in the data block are generated using the syndromes. The error correction data is sorted into multiple sets, each set corresponding to errors identified within a continuous region of the data block, e.g., a row of the data block. Finally, errors in the data block are corrected in an order defined by the sorted error correction data. In some embodiments, the error corrections are made while the data block is accessed in a predefined order, such as while streaming the data block from a memory device to another device. Because the error correction data is sorted, the use of bandwidth resources for accessing the memory device to correct the data block is minimized.

BRIEF DESCRIPTION OF THE DRAWINGS

Like reference numerals refer to corresponding parts throughout the several views of the drawings.

DESCRIPTION OF EMBODIMENTS

Figure 1:
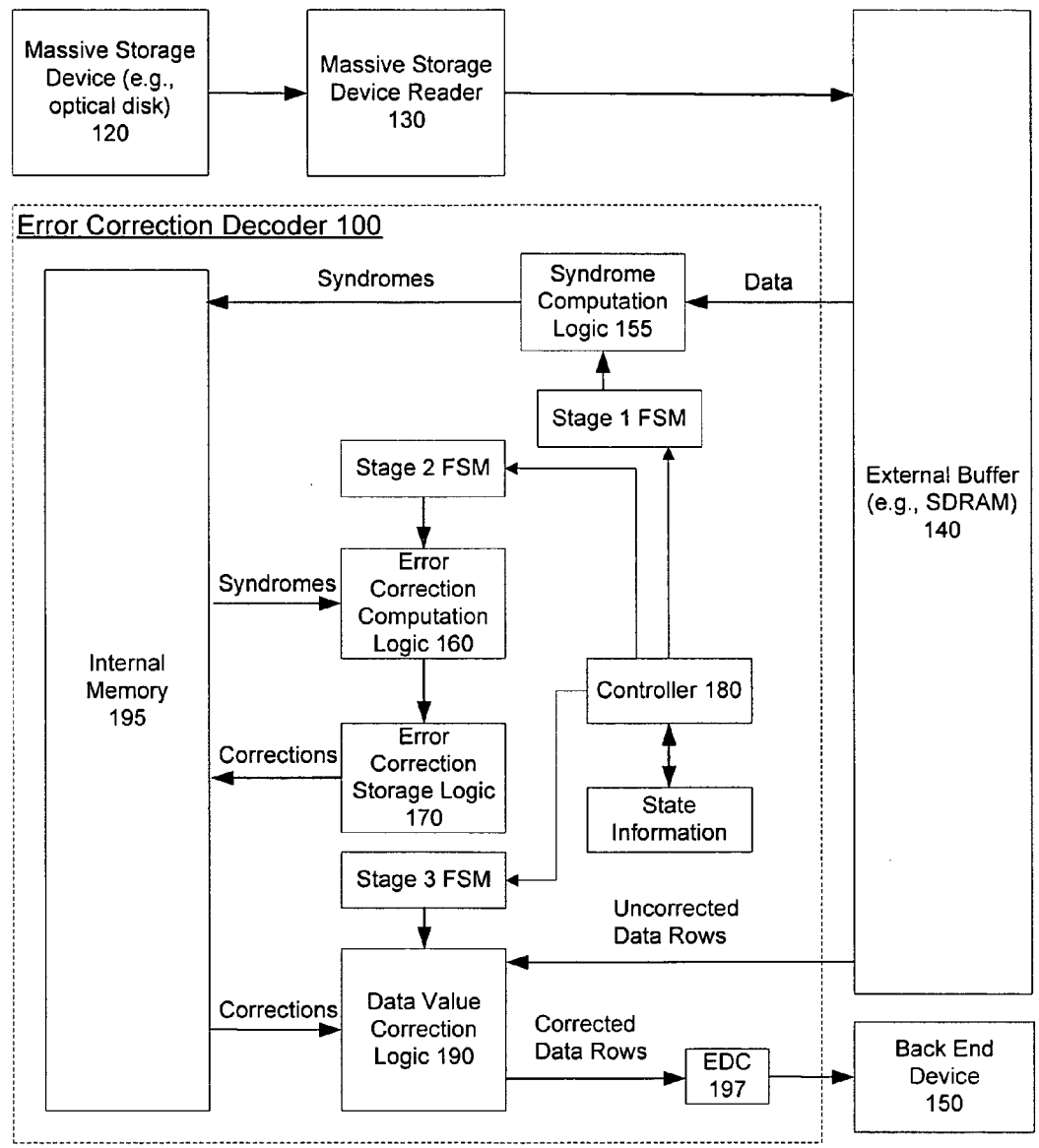
FIG. 1 is a block diagram of an error correction system including an error correction decoder according to one embodiment of the present invention.

FIG. 1 is a block diagram of an error correction system, such as an optical disk reader or read/write system, including an error correction decoder 100 according to one embodiment of the present invention. A massive storage device reader 130, such as a CDROM or DVD reader, extracts data from a massive storage device 120 and loads the data into a memory device, e.g., an external buffer 140. The massive storage device 120 may be any type of optical disk (such as CDROM, DVD, high definition DVD, magneto-optical disk or mini optical disk, etc.), flash ROM, hard disk, network attached storage (NAS) array, and the like. Depending on the type of massive storage device 120, in some embodiments the reader 130 is integrated with the massive storage device 120, while in other embodiments the reader 130 is a separate device from the massive storage device 120.

Note that buffer 140 is "external" with respect to the error correction decoder 100, but it is still "internal" with respect to the optical disk read/write system. The data stored in the buffer 140 may contain errors due to various reasons. For example, the optical disk may have a scratch across its surface, the servo may fail to fully follow a disk run out, data may have been recorded in the optical disk with a low quality (e.g., high jitter) writer, or the optical disk may be of low quality for any other reason. Therefore, the error correction decoder 100 needs to correct the errors prior to any other use of the data. In various embodiments, buffer 140 is an SRAM, DRAM, SDRAM, DDR (double data rate) SDRAM or any other type of memory device known in the art.

Figure 2A:
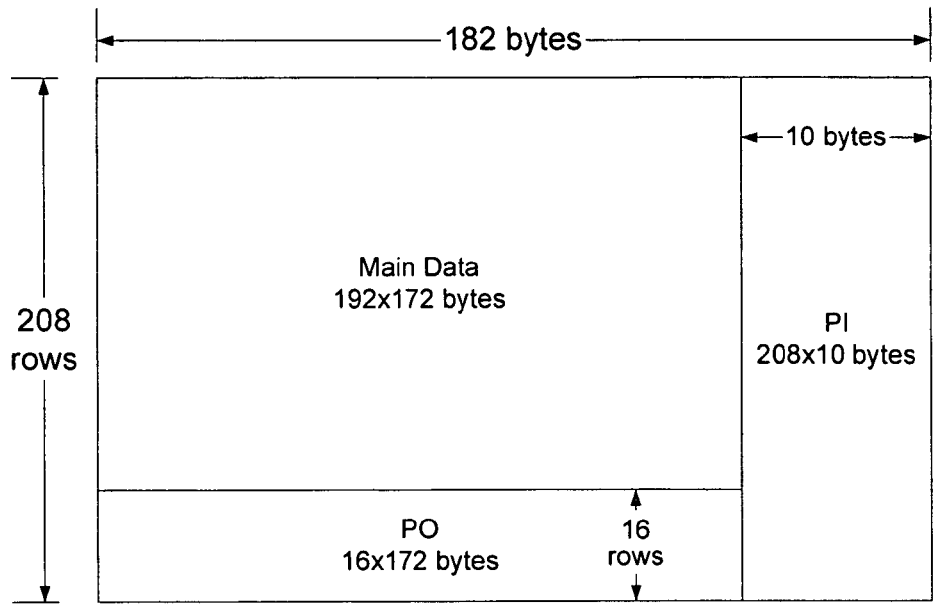
FIGS. 2A and 2B illustrate dimensions of an error correction code (ECC) block.
Figure 2B:
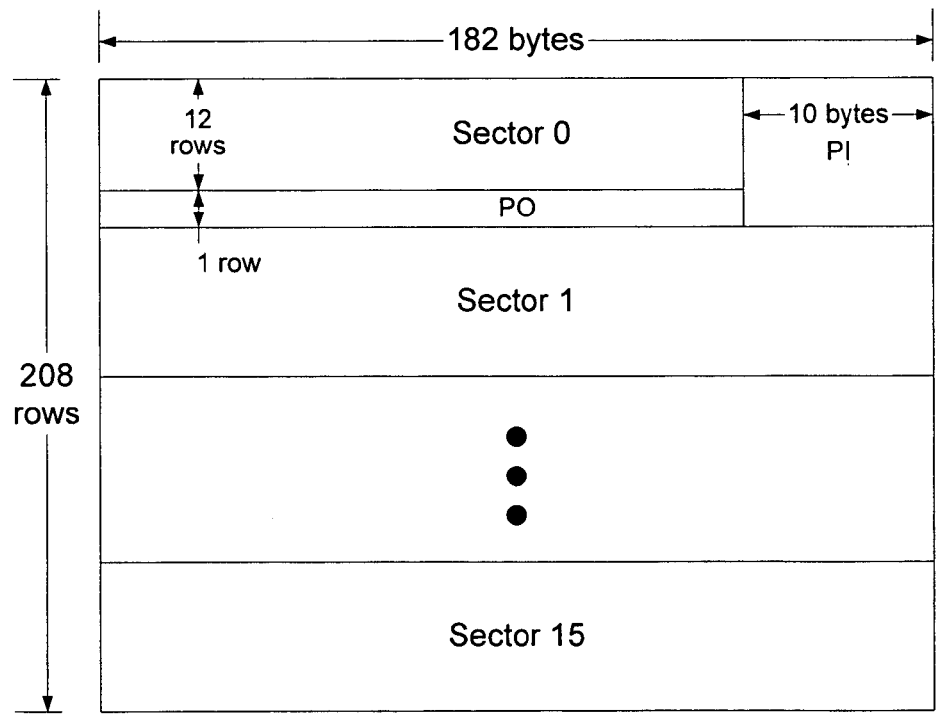

Before discussing how the data is corrected, it is worth addressing how the data is organized in the external buffer 140. A typical logical unit of data (hereinafter sometimes called "DVD data" for convenience) read from a massive storage device, e.g., a DVD, is an ECC block. As shown in FIG. 2A, an ECC block has 208 rows, each row having 182 bytes. The ECC block is divided into three distinct regions, main data, outer-code parity (PO) and inner-code parity (PI). The main data region has 192 rows, each row having 172 bytes, containing primarily user data (e.g., a video stream, text, or any other type of data) and the PO and PI regions carry redundant information that is generated from the user data in accordance with the Reed-Solomon Product Code (RSPC). In particular, each of the 172 columns in the main data region is associated with 16 PO bytes and each of the 208 rows (including 16 rows of PO data) is associated with 10 PI bytes. These PO and PI data bytes are used for identifying and correcting errors in the main data region. In the external buffer 140, the ECC block is actually divided into 16 consecutive data sectors as shown in FIG. 2B. Each of the 16 sectors has 13 rows, including 12 rows of 172 bytes of user data and 1 row of 172 PO bytes. In addition, 10 PI bytes are appended to the end of each of the 13 rows. In other embodiments, the number and arrangement of parity information or other error correction values in a data block may be different.

Referring again to FIG. 1, a controller 180 in the error correction decoder 100 issues a command to syndrome computation logic 155 to load into the decoder an ECC block from the external buffer 140. The syndrome computation logic 155 generates a syndrome for each row and each column of the block. In one embodiment, a row syndrome has a length of 10 bytes and is able to correct up to 5 error bytes, 10 erasures or a combination of errors and erasures in the corresponding row, and a column syndrome has a length of 16 bytes and can correct up to 8 error bytes, 16 erasures or a combination of errors and erasures in the corresponding column. A zero syndrome suggests that there is probably no error in the associated row or column and a non-zero syndrome indicates that there is at least one error in the associated row or column. All the syndromes are cached in another memory device, e.g., an internal memory 195 located in the error correction decoder 100.

Next, the controller 180 issues a command to error correction computation logic 160 that retrieves from the internal memory 195 the syndromes and generates error correction data using the syndromes. In an embodiment, the error correction data includes one or more error correction tuples, each tuple having a pair of row and column numbers identifying a particular location in the main data region of the ECC block and an error correction value for correcting an error at the identified location. The error correction data is transmitted to error correction storage logic 170, which allocates an appropriate location for each error correction tuple in the internal memory 195 and stores the error correction tuple (or a portion thereof) at the allocated location.

After all the error correction data associated with an ECC block has been stored in the internal memory 195, the controller 180 sends a command to data value correction logic 190 that retrieves the ECC block from the external buffer 140 row by row, corrects errors identified in each row using the error correction data stored in the internal memory 195, and sends the corrected ECC block to a back end device 150 through an EDC decoder 197. The EDC decoder 197 checks whether all errors in the ECC block have all been corrected and generates an error signal when any errors in the ECC block have not been corrected. In the embodiment shown in FIG. 1, the back end device 150 is a distinct device from the external buffer 140, such as the input buffer of a movie or audio rendering circuit, but in another embodiment the back end device 150 is the external buffer 140.

As described in more detail below, the error correction decoder 100 typically does not start the error correction process until it has accumulated and sorted all the error correction data needed to fix all the errors in an entire ECC block. Further, a single access to the ECC block in the external buffer is sufficient to correct all errors in the block. In some special cases, where the error correction decoder is unable to store all the error correction data for an ECC block, the error correction process is somewhat more complex, which will also be described below.

Figure 3A:
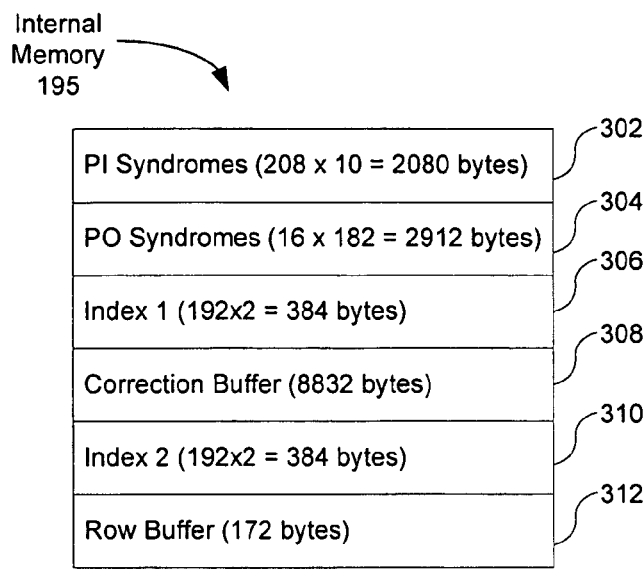
FIGS. 3A and 3B illustrate data structures in an internal memory according to one embodiment of the present invention.

FIG. 3A depicts how the internal memory 195 (FIG. 1) is partitioned into multiple sections of different sizes in order to manage different types of error correction related data according to one embodiment of the present invention. Specifically, the internal memory has two regions 302 and 304, occupying 2080 and 2912 bytes, for storing 208 PI syndromes and 182 PO syndromes, respectively. A correction buffer 308 is reserved in the internal memory 195 for managing error correction data that can correct a large number of errors. For example, in one embodiment the correction buffer 308 occupies 8832 bytes, which is large enough to store corrections for as many as 3680 errors in an ECC block. The two index tables 306 and 310 in the internal memory, each occupying 384 bytes, are used for managing error correction data associated with two consecutive ECC blocks. A more detailed discussion of the correction buffer and the two index tables 306, 310 is provided below in connection with FIG. 3B. Finally, there is a row buffer 312 of 172 bytes. This row buffer 312 is used by the data value correction logic for hosting an ECC row that is being corrected.

Figure 4:
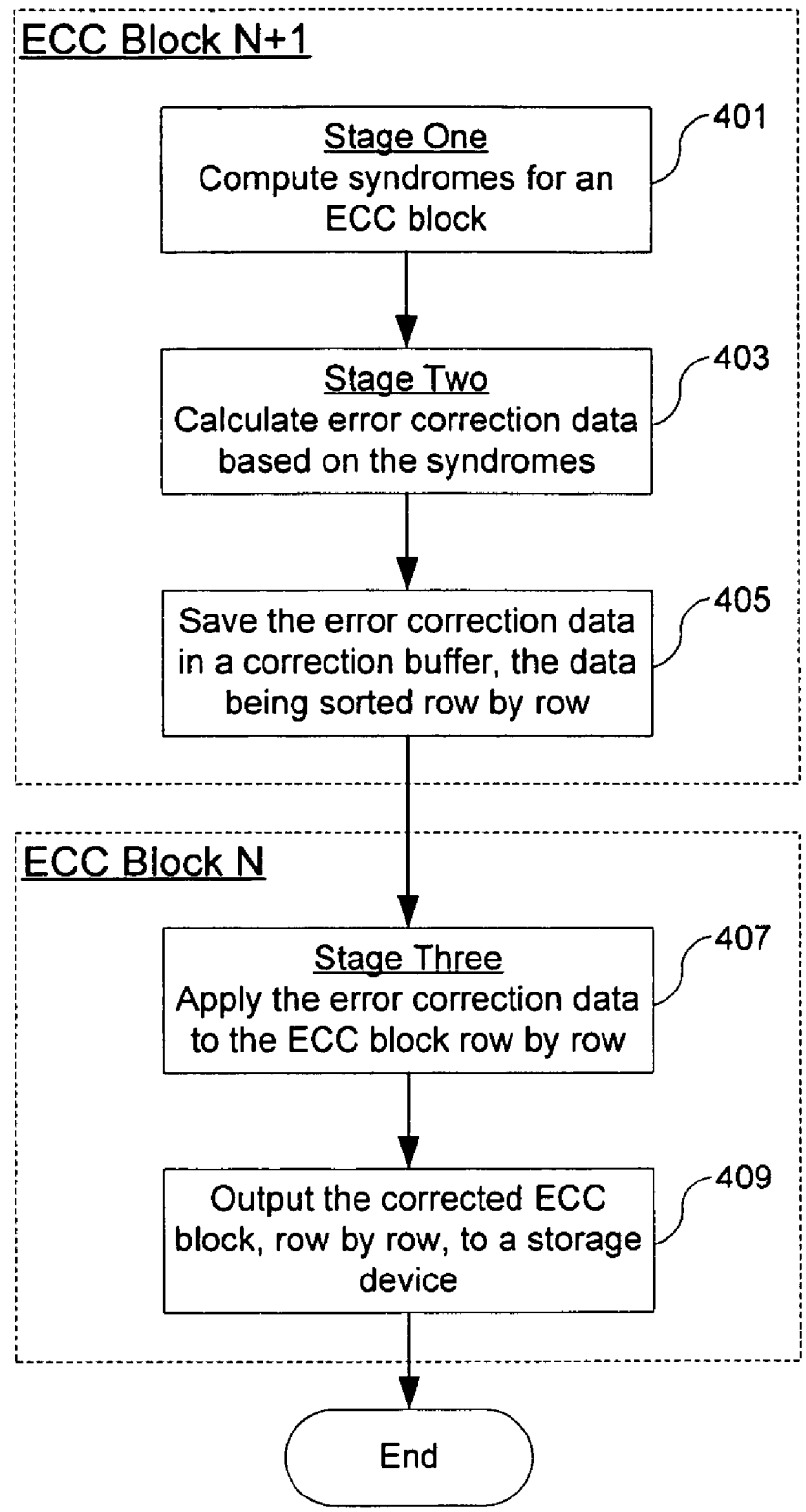
FIG. 4 is an overview flowchart of a three-stage error correction process according to one embodiment of the present invention.

FIG. 4 is an overview flowchart of the error correction process according to one embodiment of the present invention, which can be divided into three distinct stages:

Stage One: Computing syndromes for an ECC block (401);
Stage Two: Calculating error correction data based on the syndromes (403) and saving the error correction data in a correction buffer (405); and
Stage Three: Applying the error correction data to the ECC block row by row (407).

Except in unusual cases described in more detail below, while Stage Three of the data value correction logic corrects errors identified in ECC block N, Stage One and Stage Two of the error correction decoder process the next ECC block, ECC block N+1. In order for Stage One and Stage Two to be able to process ECC block N+1, there must be sufficient space in the correction buffer for hosting the error correction data associated with ECC block N+1. In most cases, the number of errors in each ECC block is much less than the maximum number of correctable errors. Corrections for the next ECC block can be generated and stored when at least one line in the correction buffer is free. When a correction needs to be saved, if a new line is needed and there is no free line, Stage Two will wait for a free line. Alternately, a FIFO may be inserted between the calculating circuitry 160 and saving circuitry 170 that perform Stage Two, so that the generation of error correction values can continue as long as the FIFO has free entries. Thus, in most cases there will be sufficient space for processing the ECC block N+1 in Stage 1 and Stage 2 while ECC block N is processed by Stage 3 of the error correction decoder. Therefore, two consecutive ECC blocks can processed in pipelined fashion by the error correction decoder to reduce time delay caused by the error correction process.

Figure 3B:
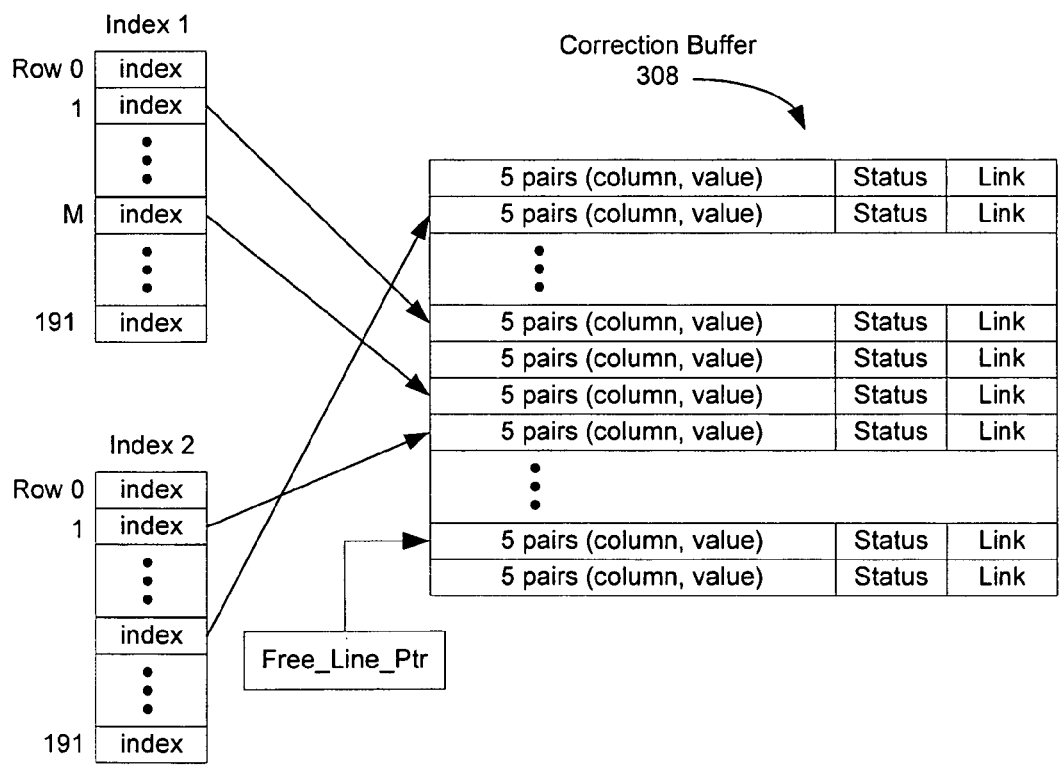

FIG. 3B illustrates how the two index tables 306, 310 are invoked to manage two consecutive blocks' error correction data sharing the correction buffer. Note that each line in the buffer can house 5 pairs of (column, value) associated with a particular ECC row as well as a status value indicating how many pairs have been allocated in this line and a link pointing to another line in the correction buffer that has also been allocated for storing additional error correction data associated with the same ECC row. If only one line is used to store error correction data for a particular ECC row, the link value is left blank or at a default value. For purposes of this explanation, we will assume that the index table 1 is associated with ECC block N and that the index table 2 with ECC block N+1. During actual use, the index table representing the earlier of two successive data blocks changes with each processing cycle. Each index table has 192 entries, each entry representing one row in the corresponding ECC block. The free lines in the correction buffer are connected together, forming a linked list with a pointer Free_Line_Ptr referencing the head of the linked list.

To insert a new error correction tuple associated with row M of ECC N, the entry M in the index table 1 is first located. If the entry M is blank, there is currently no error correction tuple associated with row M in the correction buffer. In response, the first free buffer line in the linked list referenced by the pointer Free_Line_Ptr is tapped for storing the column number and error correction value of the error correction tuple and the entry M of index table 1 is populated with a pointer to the buffer line in the correction buffer. The buffer line is removed from the free lines linked list, and its status and link parameters are updated to reflect the change. The pointer Free_Line_Ptr then points to the new head of the linked list, which was previously the second item in the linked list of free lines.

If the entry M of index table 1 is not empty, the status of the buffer line referenced by entry M is checked to determine if there is still free space available in the buffer line. If so, the new tuple's column number and correction value form a new pair in the buffer line and the line's status is increased by 1. If the line is already full, the first free line is removed from the linked list for storing the new pair. The pointer in the entry M of index table 1 is also updated to reference the new buffer line whose link points to the line which is full. In other words, the buffer lines used for storing error correction tuples associated with a particular ECC row form another linked list. In one embodiment, the link list of buffer lines is similar to a stack because a newly added buffer line is placed at the beginning or "top" of the linked list, thereby "pushing" down the buffer line or lines previously allocated to the same data row in the linked list.

After all the error correction tuples associated with ECC block N have been stored in the correction buffer, and all applicable corrections have been applied to ECC block N−1 using index table 2, the controller instructs the data value correction logic to start correcting errors in the ECC block N. At the same time, the Stage 1 and Stage 2 logic in the error correction decoder can start processing the next ECC block, ECC block N+1, using index table 2 to track the error correction tuples in the correction buffer that are associated with ECC block N+1.

FIGS. 5A-5E are flowcharts that provide details of the last two stages of the error correction process according to one embodiment of the present invention. It is assumed that the first stage, the syndrome computation, has been finished and that all the syndromes associated with ECC block N are currently stored in the internal memory 195 (FIG. 1).

Figure 5A:
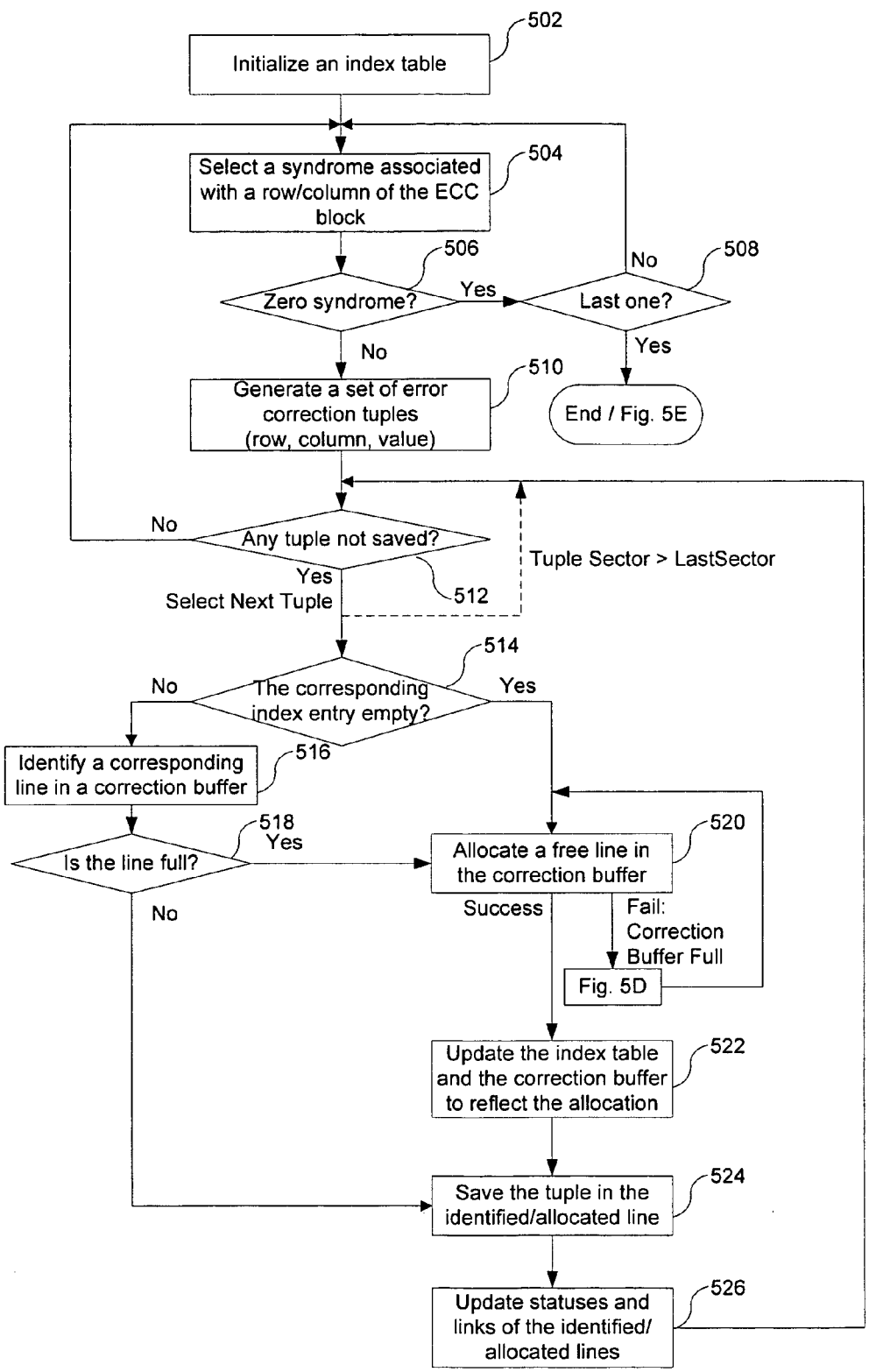
FIGS. 5A-5E are flowcharts illustrative of details of the error correction generation and data value correction according to one embodiment of the present invention.

As shown in FIG. 5A, the second stage begins with initializing one of the two index tables (502). Next, one of the syndromes associated with a row or column of ECC block N is selected (504). If this syndrome is zero (506), the error correction computation logic then checks if this is the last syndrome to be processed (508) and acts accordingly. If the selected syndrome is not zero, indicating that there is at least one error in the associated row or column, the logic generates one or more error correction tuples (row, column, value) at 510 and passes the tuples to the error correction storage logic, which is responsible for allocating space and storing the tuples in the correction buffer.

The allocation of space in the correction buffer for error correction tuples is an iterative process. First, the error correction storage logic checks if all the tuples it has received have been saved in the correction buffer (512). If true, the allocation is terminated and the error correction storage logic waits for a next set of tuples coming from the error correction computation logic. If false, the error correction storage logic identifies an entry in the index table that corresponds to the tuple's row number and checks if the index entry is empty or not (514).

If the index entry is empty (514-Yes), the error correction storage logic allocates a free buffer line for the index entry (520). Note that the allocation may fail if there are no free lines available in the correction buffer. The handling of this condition will be addressed in more detail below in connection with FIG. 5D. For now, let us assume that a free buffer line is allocated at 520. The error correction storage logic populates the index entry with the index of the free line in the correction buffer and updates the Free_Line_Ptr parameter to remove the buffer line from its linked list (522). Next, the error correction storage logic saves the tuple in the newly allocated buffer line (524) and updates the status of the buffer line (526).

If the index entry is not empty, the error correction storage logic identifies a buffer line in the correction buffer using the buffer line index stored in the index entry (516). Next, the error correction storage logic checks the identified buffer line's status to determine if it is full or not (518). If the buffer line is not full (518-No), the error correction storage logic saves the tuple in the identified line (524) and updates its status accordingly (526). Otherwise, the logic allocates a new free line for the error correction tuple, which is essentially the same process as the previous case when the index entry is empty. The only difference is that at 526 the link in the newly allocated buffer line is updated to reference the buffer line which is currently full, while in the former case (when a first buffer line has been allocated for a data row) the link of the newly allocated buffer line has a null pointer.

After allocating a buffer line and updating its contents (526), the error correction storage logic begins processing a next error correction tuple (512), if any, until all the tuples have been allocated space and stored in the correction buffer.

Figure 5B:
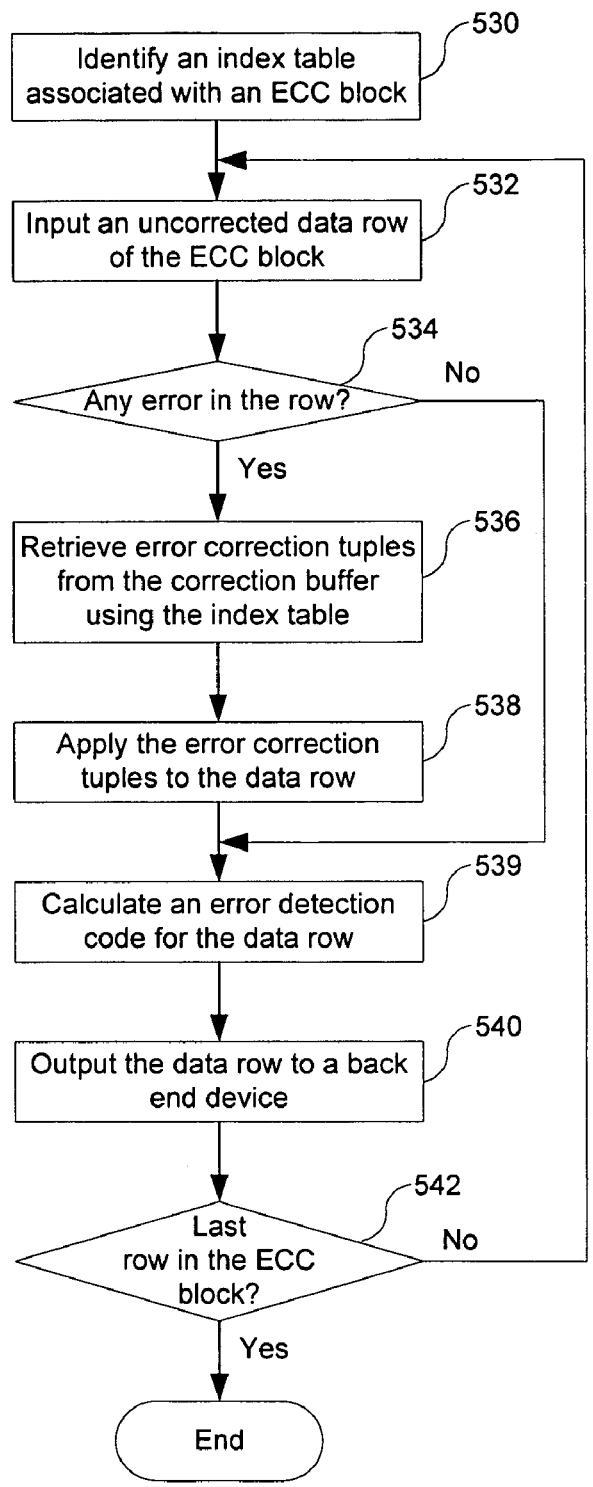

FIG. 5B is a flowchart illustrative of the operation of the data value correction logic according to one embodiment of the present invention. This flowchart assumes that all error correction data associated with ECC block N have been sorted and saved in the correction buffer according to their respective ECC row numbers. The Stage Three processing of the ECC Block N begins (530) with the data value correction logic identifying one of the two index tables that is associated with the ECC block N. Then, the data value correction logic reads each row of the ECC block N (532) and checks whether the data row's associated index entry is empty or not (534). An empty index entry indicates that there is no error correction data associated with the data row. Accordingly, the data value correction logic exports the data row (540) to a back end device, e.g., a memory buffer.

For each non-empty index entry (534-Yes), the data value correction logic visits one or more buffer lines in the correction buffer according to the value in the index entry and retrieves one or more error correction tuples from the correction buffer (536). The data value correction logic corrects errors in the data row using the retrieved error correction tuples (538). For each tuple, the data value correction logic identifies a data byte at a particular location in the data row based on the column number of the tuple, and then XORs the identified data byte with the error correction value. The XOR result replaces the incorrect data byte at that particular location. After all the tuples have been used once, the data value correction logic outputs the corrected data row to the back end device (540) through the EDC decoder 197 (FIG. 1) that verifies the correctness of the last twelve corrected data rows that correspond to one sector. The logic then proceeds to checks if the exported data row is the last one in the ECC block (542). If so, the processing of the ECC block N is complete. Otherwise, the logic returns to 532 to process a next row in the ECC block.

As mentioned above in connection with FIG. 3B, the correction buffer is shared by error correction data of two consecutive ECC blocks N and N+1. When a row of ECC block N has been corrected, the buffer line occupied by its associated error correction data can be released for ECC block N+1.

Figure 5C:
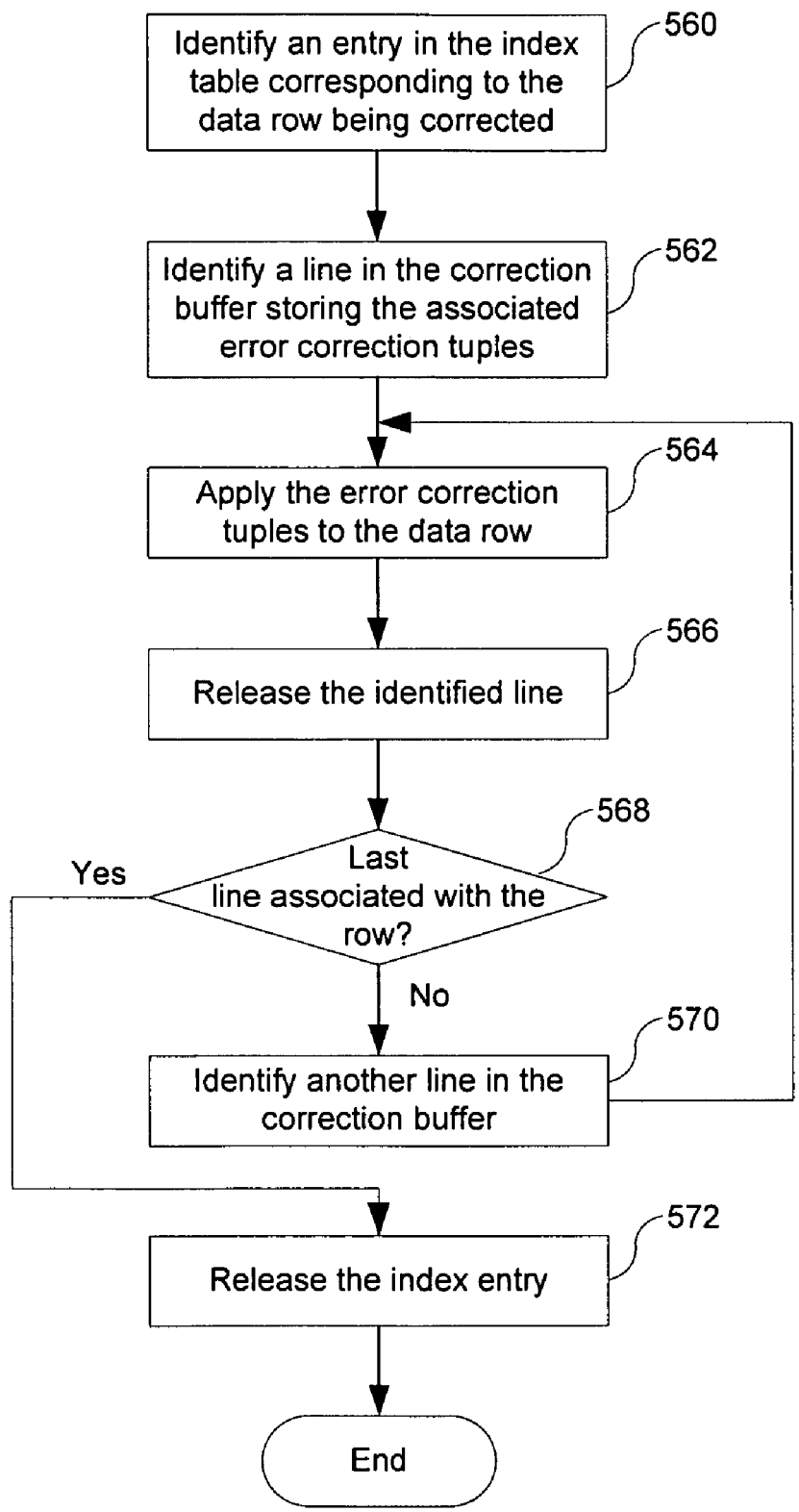

FIG. 5C is a flowchart illustrating how the data value correction logic clears buffer lines according to one embodiment of the present invention. The entire set of operations shown in FIG. 5C replaces operations 536 and 538 in FIG. 5B. Note that operations 560 (identifying an entry in the index table corresponding to the data row being corrected) and 562 (identifying a line in the correction buffer storing the associated error correction tuples) here correspond to operation 536 in FIG. 5B, and operation 564 (applying the error correction tuples to the data row) is the same as operation 538, except that operation 564 applies the tuples from a single correction buffer line to a data row while operation 538 (FIG. 5B) applies all the tuples for a data row, even if those tuples come from correction buffer lines. After applying all the tuples in a buffer line to an ECC row (564), the logic releases the buffer line back to the free buffer line linked list (566). The releasing operations include marking the buffer line's status as empty, setting the released buffer line's link to reference the current head of the linked list, and setting the parameter Free_Line_Ptr to reference the released buffer line. These operations put the released buffer line at the top of the linked list of free buffer lines.

Following the release of a buffer line (566), the data value correction logic checks if the newly released buffer line is the last one associated with the ECC row being corrected (568). If so (568-Yes), the data value correction logic at step 572 also releases the index entry associated with the ECC row (572), thereby indicating that the error correction of the data row is finished. Otherwise (568-No), the data value correction logic identifies the next buffer line associated with the ECC row (570) and returns to 564 to correct more errors in the ECC row using the newly identified buffer line.

Referring again to FIG. 5A, an implicit assumption behind operation 520 is that the correction buffer has free buffer lines available and the request for a new buffer line can be satisfied. In some embodiments, however, this assumption may not be always valid. For example, if the correction buffer size is smaller than the size required to store the maximum number of error corrections for an ECC block, operation 520 may fail while processing an ECC block having a significant number of errors. In this case, it is necessary to clear some buffer lines in the correction buffer so that additional buffer lines can be allocated at 520.

According to one embodiment, an ECC block is corrected sector by sector and row by row. However, error correction tuples are actually generated in a random order. For example, a PO syndrome may produce 8 error correction tuples at 8 different rows, which may even be in 8 different sectors. One buffer line clearing strategy is that the error correction storage logic first clears lines reserved for the last sector of an ECC block, Sector 15, since it is the last one to be corrected. If there is still insufficient space after the clearing, the logic clears additional lines associated with sector 14, and possibly additional sectors until the request is satisfied at step 520. In another embodiment, the error correction storage logic clears the buffer lines associated with a single data row each time a buffer full condition is detected at 520. Each time more space is needed, the buffer line or lines for an additional row are cleared, starting with the last row of the ECC block and moving one row at a time toward the beginning of the ECC block.

Figure 5D:
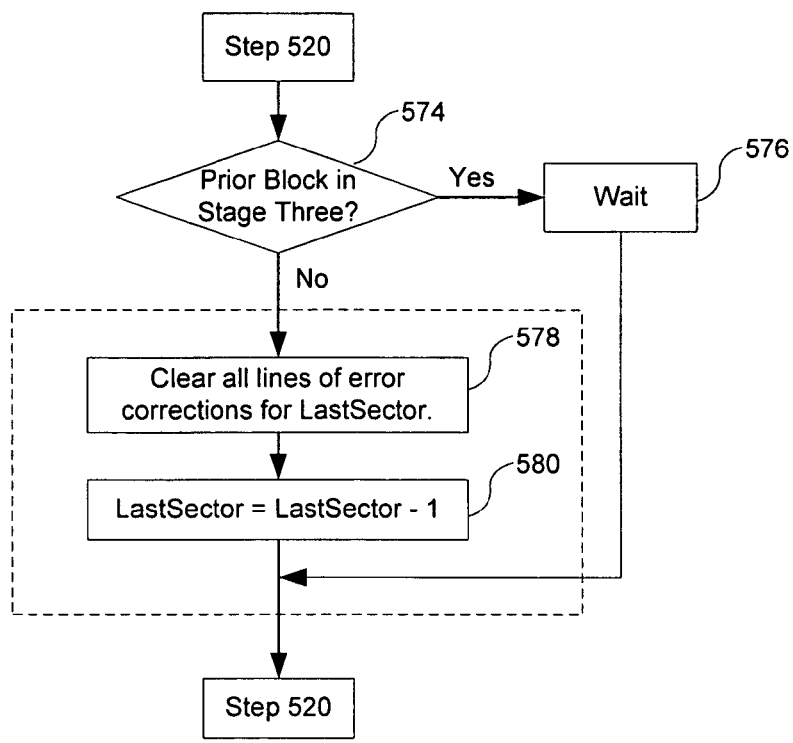

FIG. 5D is a flowchart illustrating this buffer line clearing process according to one embodiment of the present invention. The error correction storage logic has an associated parameter LastSector, indicating the last sector whose error correction data is stored in the correction buffer. This parameter is initially set to be 15, the last sector of the ECC block. If the initial request for allocating a new free line fails at 520, the error correction storage logic at step 574 checks if the Stage 3 data value correction logic is still correcting errors in a prior ECC block. If so (574-Yes), the error correction storage logic waits (576) for the data value correction logic to release buffer lines after it corrects the errors in the prior ECC block. Otherwise (574-No), since all the buffer lines are now occupied by the current ECC block, the error correction logic has to clear certain buffer lines associated with the LastSector sector (578) to make room for error correction data associated with sectors whose number is smaller than LastSector. The error correction storage logic then reduces the parameter LastSector by 1 (580). Next, the error correction storage logic resumes performance of operation 520 (FIG. 5A). If operation 520 fails again, additional buffer lines will be cleared by repeating the process represented by FIG. 5D. Since the parameter LastSector is now smaller than 15, when the error correction storage logic identifies any error correction tuple at 512, it needs to verify whether the tuple is associated with a sector larger than LastSector. If true, there is currently no room for the tuple in the correction buffer and the logic has to discard it as indicated by the dashed line in FIG. 5A. As a result, after the error correction computation logic processes the last syndrome at 508, it needs to check the parameter LastSector to make sure all the 16 sectors of the current ECC block have been processed. Also, at this point, the third stage processes the rows in sectors 0 through LastSector, correcting those rows and sending them to the back end device 150 (FIG. 1).

Figure 5E:
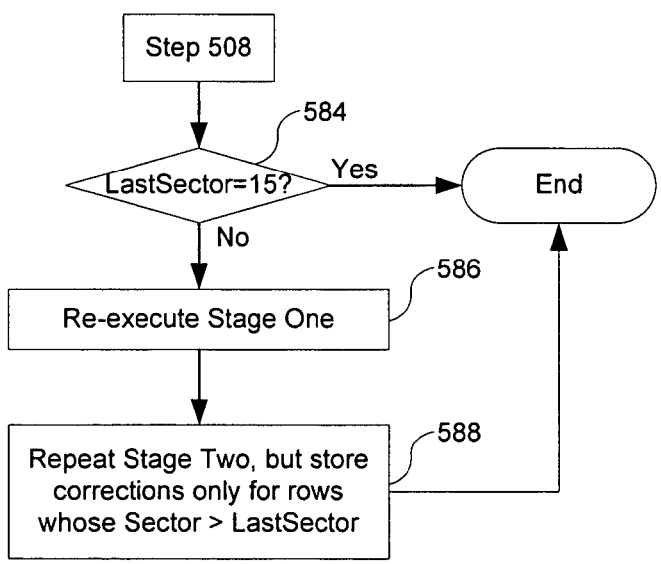

FIG. 5E is a flowchart illustrating this process. At 584, the error correction computation logic checks if the parameter LastSector is 15. If true, all the sectors in the ECC block have been processed. If not, the syndrome computation logic needs to repeat both the first stage (586) and the second stage (588) for the current ECC block. During re-execution of the first stage (586), the ECC block is read from the external buffer for a second time so as to enable the re-computation of the syndromes. During re-execution of the second stage (588), the error correction storage logic only stores error correction tuples associated with the sectors whose numbers are greater than LastSector. When the processing of the ECC block returns to third stage, only those sectors (LastSector through 15) are transferred to the back end device, since sectors 0 to LastSector have already been processed by the third stage.

Figure 6A:
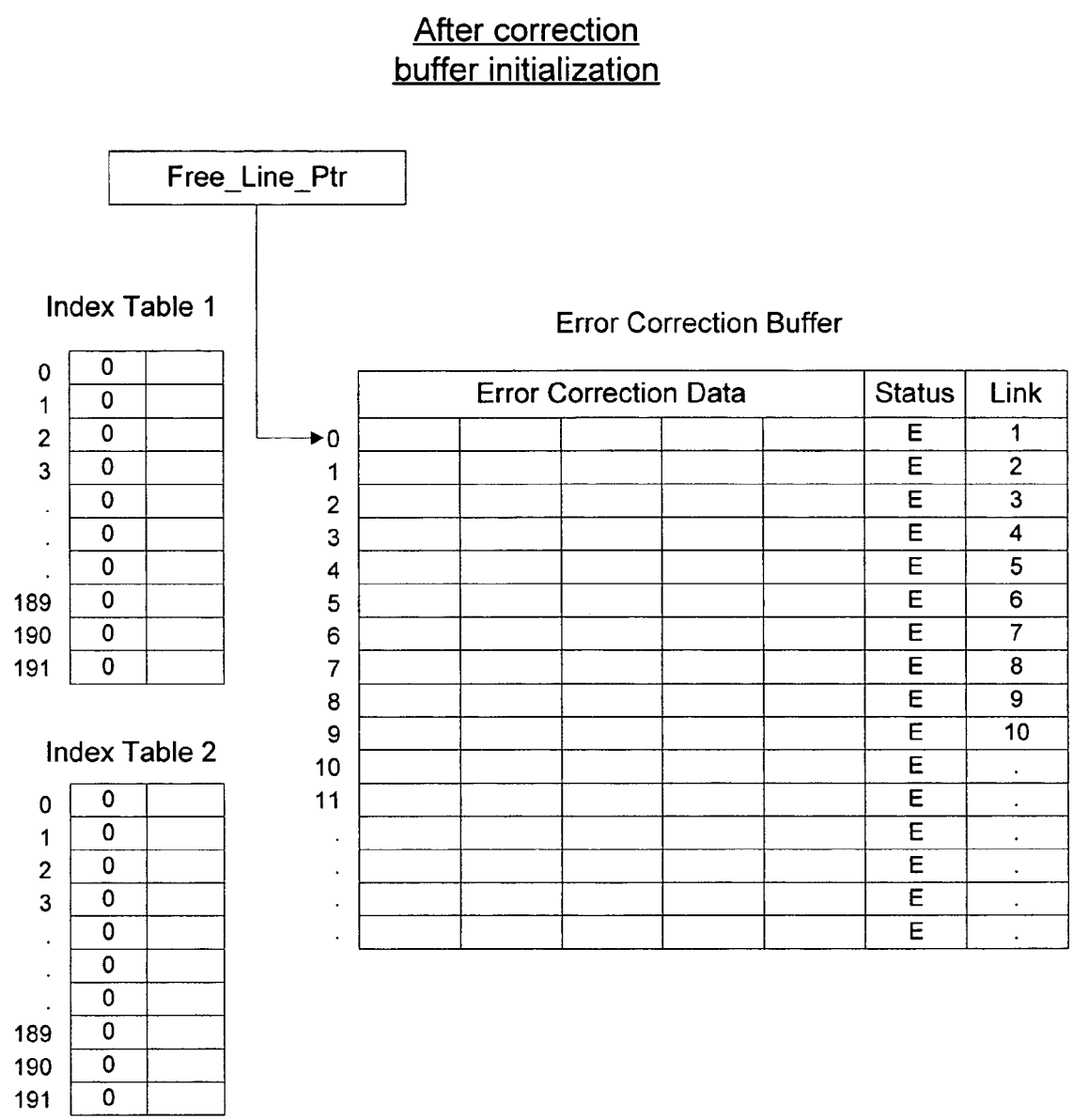
FIGS. 6A-6F illustrate an example of how to allocate and deallocate error correction tuples in a correction buffer according to one embodiment of the present invention.

FIGS. 6A-6F illustrate an example of how to allocate error correction tuples in a correction buffer and then remove them according to one embodiment of the present invention. FIG. 6A depicts the correction buffer and the two index tables after they have been initialized. Note that the buffer lines in the correction buffer are connected together into a linked list and the parameter Free_Line_Ptr points to the head of the linked list. All the lines' status is set to be E (or empty). Each index table has 192 entries (0-191) and each entry in the index table has a status bit indicating that it has not been claimed (0).

Figure 6B:
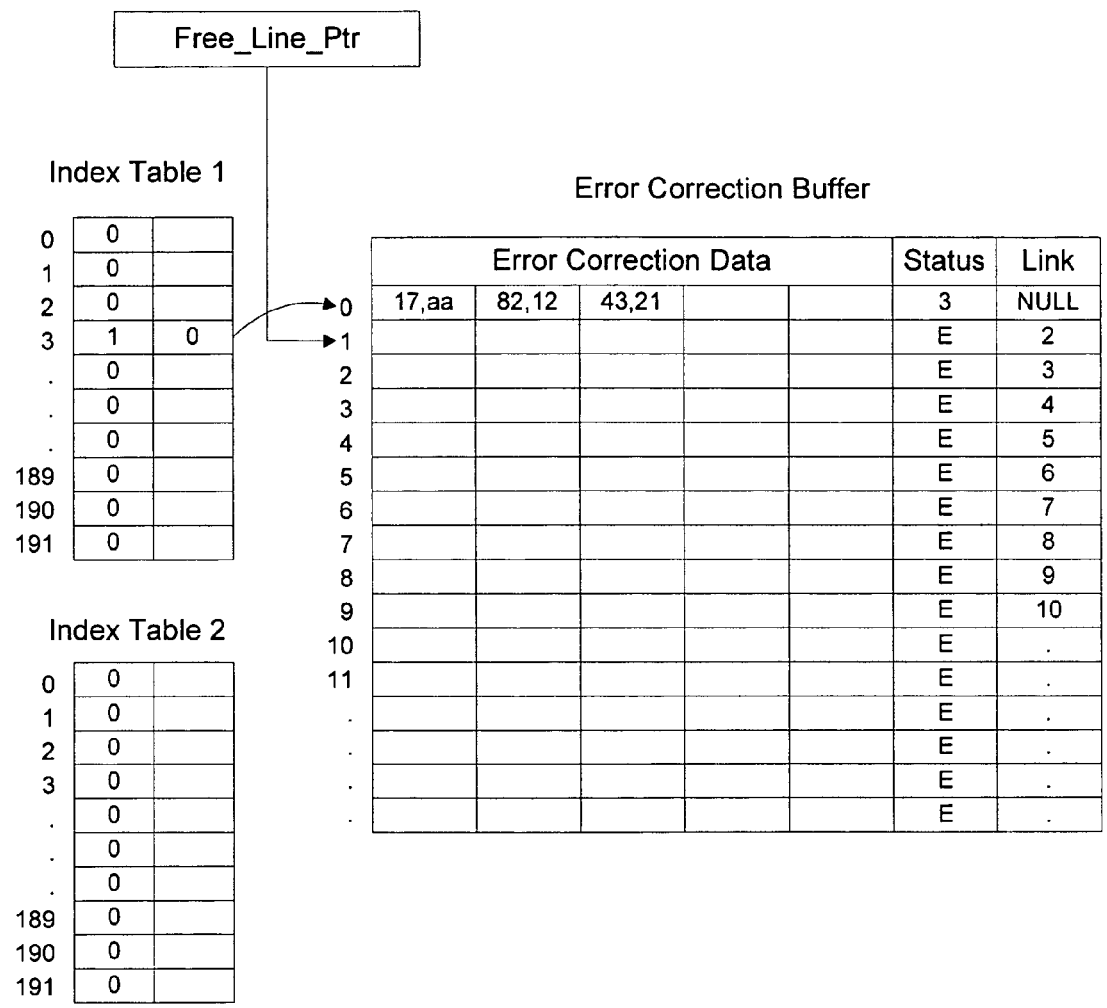

In FIG. 6B, the entry for data row 3 in the index table 1 has been reserved (1) by the error correction storage logic, and it has a pointer referencing line 0 in the correction buffer. The line's status is 3, indicating that there are three error correction pairs (17, aa), (82, 12) and (43, 21). Since this line has been reserved for row 3 of the ECC block, it is no longer part of the linked list. The buffer line's link is set to null and the parameter Free_Line_Ptr now points to the line 1, which is the new head of the linked list.

Figure 6C:
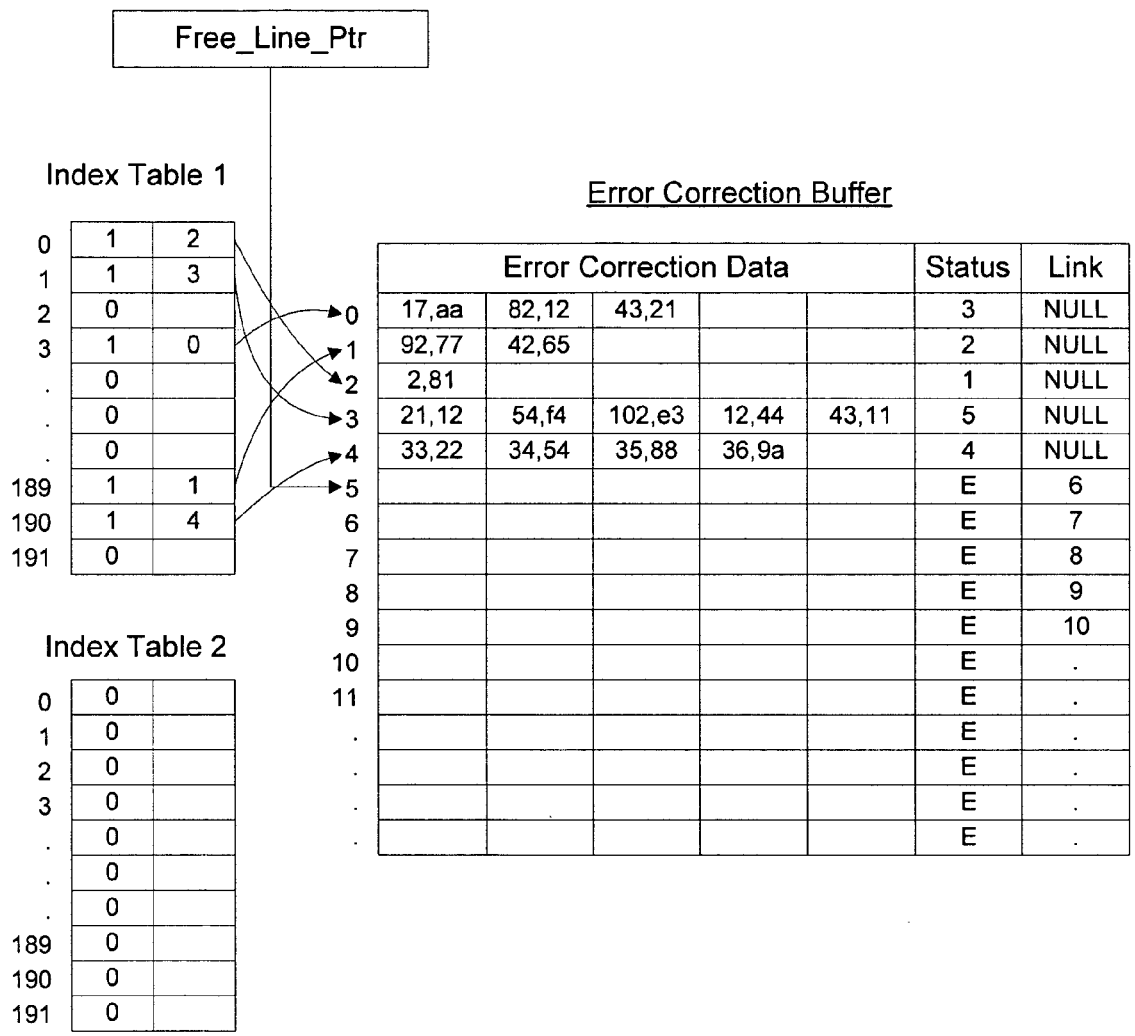

FIG. 6C depicts a snapshot after more entries in the index table 1 and more buffer lines in the correction buffer have been populated by the error correction storage logic. The parameter Free_Line_Ptr now points to the line 5 in the correction buffer. The entry 1 in the index table 1 refers to the line 3 in the correction buffer, which is already full (i.e., 5 error correction pairs). If there is another error identified in the row 1 of the ECC block, its associated tuple has to be put into another line in the correction buffer.

Figure 6D:
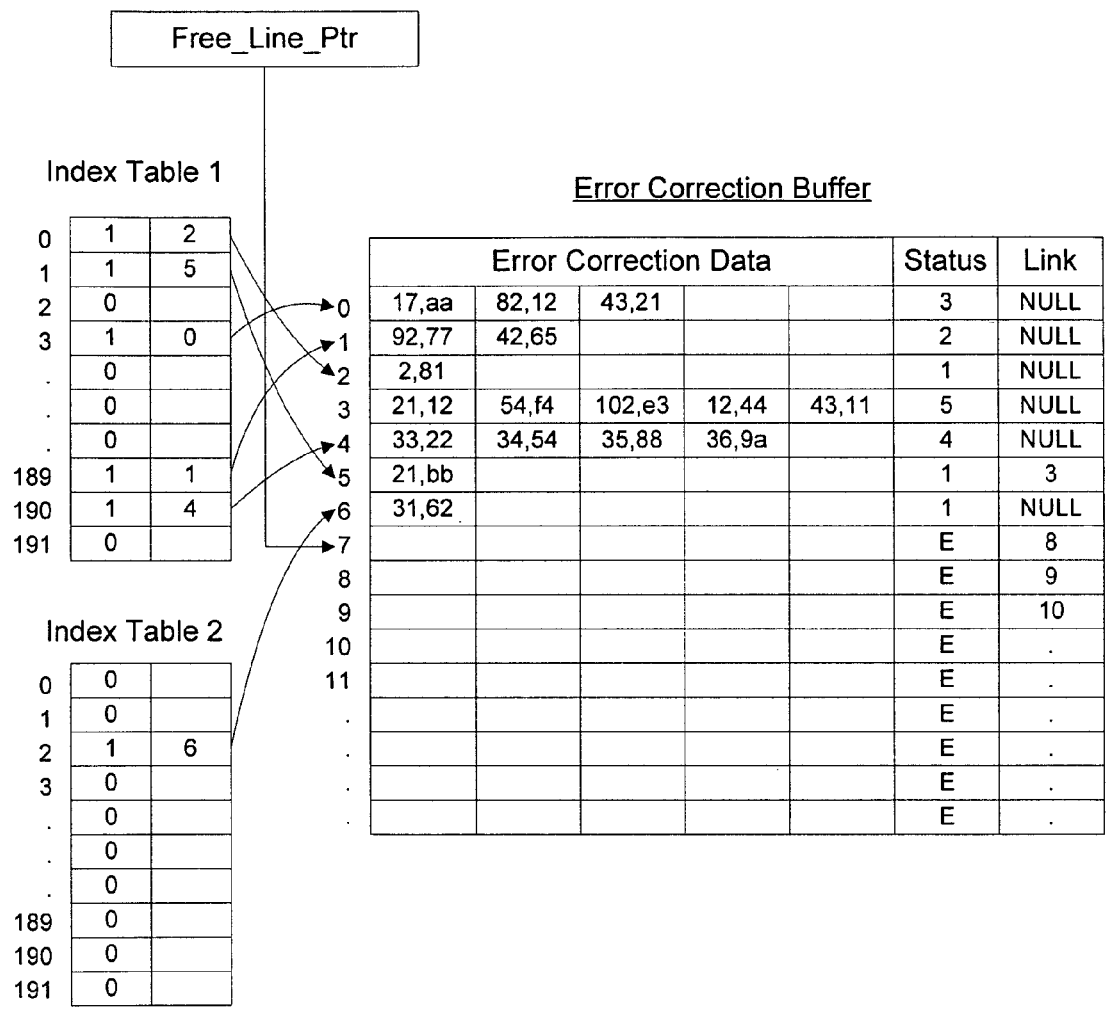

As shown in FIG. 6D, the line 5 in the correction buffer is allocated for the sixth error correction tuple associated with the row 1. Lines 5 and 3 form a stack-styled linked list with line 5 being the head of the linked list. The entry 1 in the index table 1 is updated accordingly to from 3 to 5. Meanwhile (e.g., if stage two processing of the ECC block is completed and processing of a new ECC block begins), line 6 of the correction buffer is tapped by the entry 2 of the index table 2, which corresponds to the row 2 of another ECC block. The parameter Free_Line_Ptr indicates that line 7 is the new head of the linked list of free buffer lines.

Figure 6E:
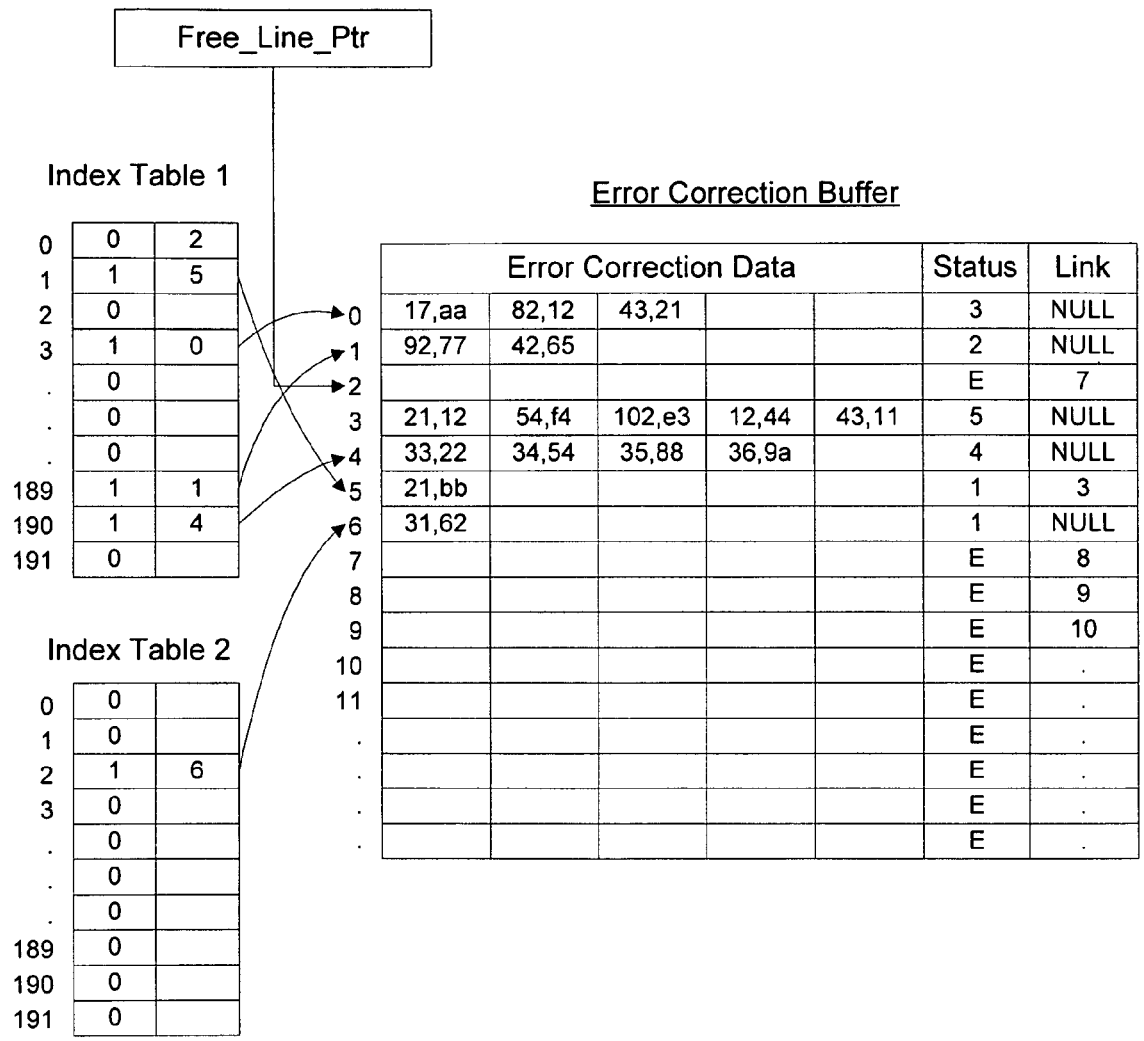

FIG. 6E depicts the change to the correction buffer and the index tables after one buffer line is released. Specifically, the status of the entry 0 of the index table 1 is changed back from 1 to 0, indicating that errors in the ECC row 0 have been corrected. Even though the entry 0 still has a pointer to correction buffer line 2, the status (0) of the entry indicates that this pointer is no longer valid. Line 2 in the correction buffer has become the new head of the free line linked list and is no longer affiliated with the index table entry 0. The status of the correction buffer line 2 is marked "E" to indicate that this line is currently empty, and the link field in this correction buffer line is set to be 7, referencing correction buffer line 7 in the linked list. Any correction data left in correction buffer line 2 is now invalid.

Figure 6F:
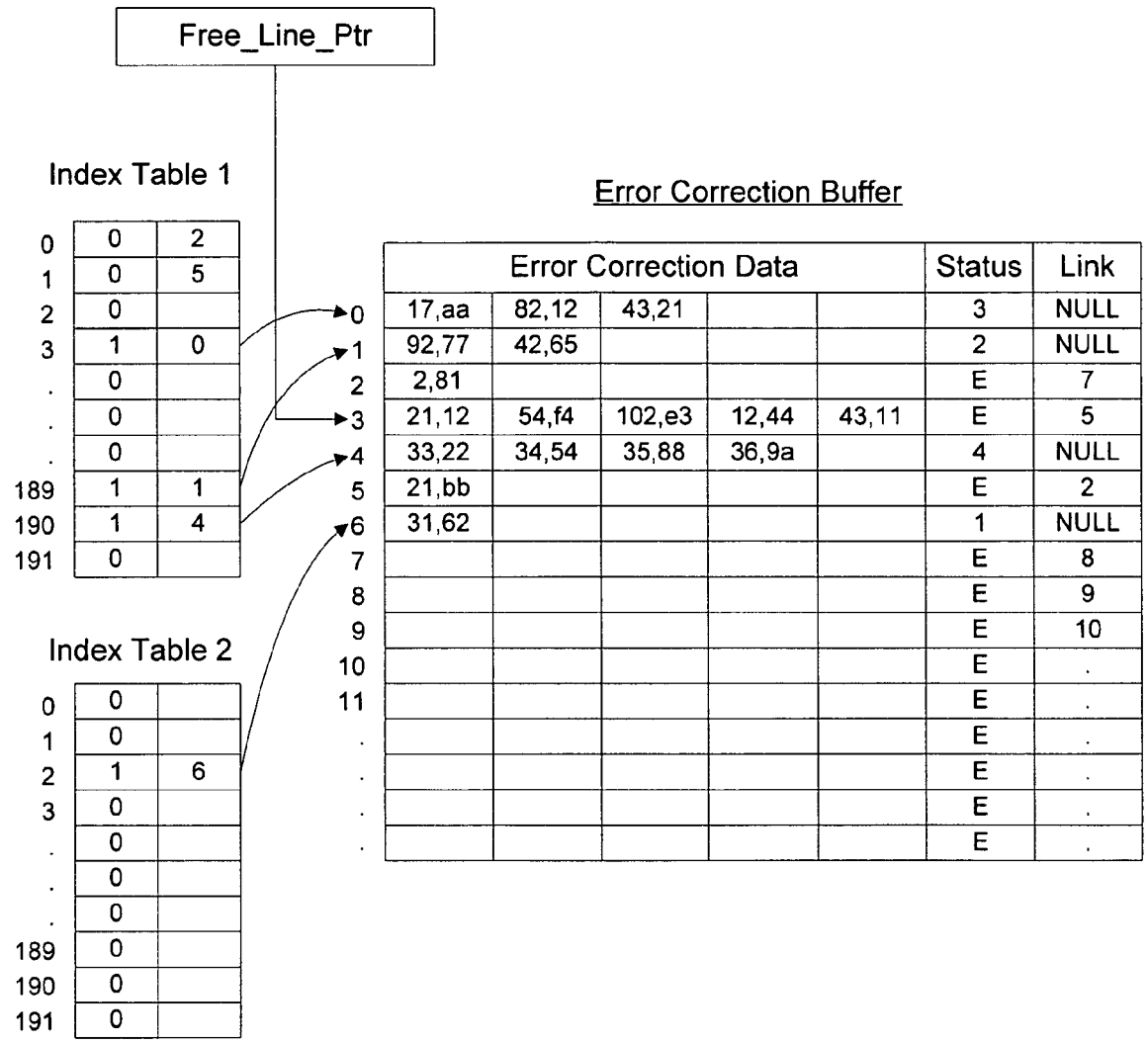

In FIG. 6F, the status of the entry 1 of index table 1 has been changed to "0" and its associated linked list of buffer lines 5 and 3 have been released back into the free line linked list, with line 3 being the new head of the linked list.

Figure 7:
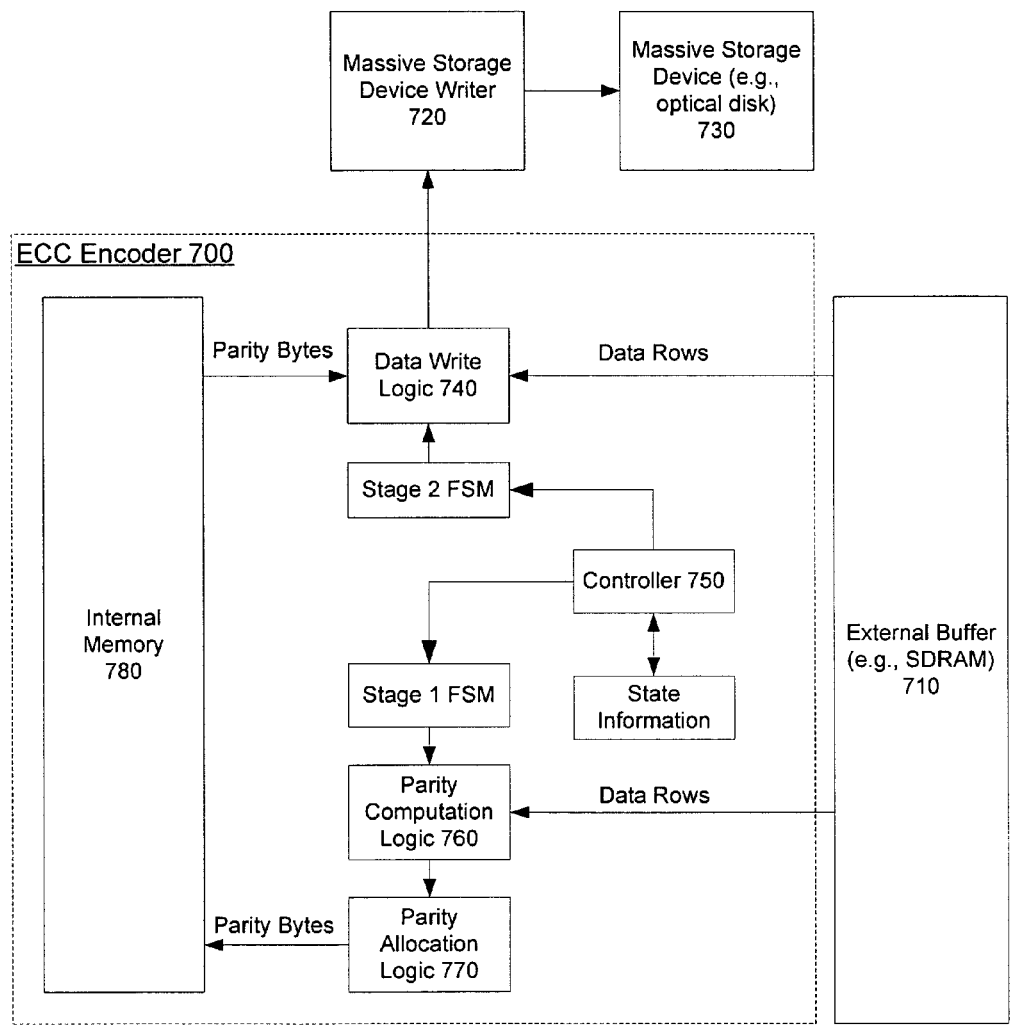
FIG. 7 is a block diagram of an ECC encoder according to one embodiment of the present invention.

The memory bandwidth concern addressed by the embodiments discussed above is not unique to ECC decoding, and is also of concern during ECC encoding. Luckily, ECC encoding can also benefit from use of a buffer like the internal memory shown in FIG. 1. FIG. 7 is a block diagram of an ECC encoder 700 according to one embodiment of the present invention. The ECC encoder 700 receives user data blocks from an external buffer 710, converts the user data blocks into ECC blocks and writes the ECC blocks onto a recordable medium using an appropriate recording apparatus, such as a massive storage device 730 through a massive storage device writer 720. Like the massive storage device 120 in FIG. 1, the massive storage device 730 may be any type of optical disk (including CDROM, DVD, high definition DVD, magneto-optical disk or mini optical disk, etc.), flash ROM, hard disk, NAS array, or the like. Depending on the type of massive storage device 730, in some embodiments the writer 720 is integrated with the massive storage device 730, while in other embodiments the writer 720 is a separate device from the massive storage device 730.

To generate an ECC block, the controller 750 in the ECC encoder 700 sends a command to parity computation logic 760 which receives a user data block from an external buffer 710 and generates error correction values for the user data block. For instance, in some embodiments the parity computation logic 760 generates parity bytes, sometimes called PI and PO bytes, for the user data block in accordance with the Reed-Solomon Product Code. The parity allocation logic 770 receives the parity bytes and saves them in the internal memory 780 in a predetermined order. More details about the ordering of the parity bytes in the internal memory 780 are provided below in connection with FIGS. 8A and 8B. In some embodiments, the internal memory 780 used by the ECC Encoder 700 is the same as the internal memory 195 used by the Error Correction Decoder 100, both of which may be included in a single integrated circuit for handling ECC encoding and decoding in a DVD read/write device. Further, in some embodiments, external buffer 710 used by the ECC Encoder 700 is the same storage or memory device as the external buffer 140 used by the Error Correction Decoder 100 (FIG. 1), while in other embodiments two distinct external buffers 140, 710 are used by the decoder 100 and encoder 700. Note that the external memory/buffer of the present invention supports various memory architectures including, but not limited to, SRAM, DRAM, SDRAM or DDR SDRAM, etc.

After generating and caching all the error correction values (e.g., parity bytes) associated with the user data block in the internal memory 780, the controller 750 sends a signal to the data write logic 740, which retrieves each row of user data bytes from the external buffer, extracts the relevant parity bytes from the internal memory in a sequential order, merges the two types of data into an ECC row, and transmits the ECC row for recording in the massive storage device 730.

As shown in FIG. 2B, an ECC block comprises 16 sectors, each sector including 13 rows of 182 bytes. Each of the first 12 rows has 172 bytes of user data followed by 10 PI bytes and the last row has 172 PO bytes followed by 10 PI bytes. Therefore, there are a total of 4832 parity bytes for each ECC block. The parity allocation logic 770 organizes the parity bytes in such a way that it is very efficient to locate and retrieve parity bytes associated with a data sector in the internal memory. In one embodiment, the size of the internal memory shown in FIG. 2A is about 14K bytes, allowing it to host at least two blocks' parity bytes.

Figures 8A, 8B:
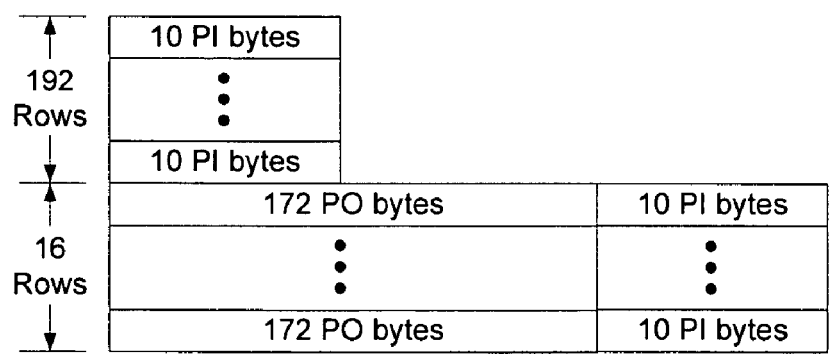
FIGS. 8A and 8B are block diagrams illustrating how the internal memory is partitioned into multiple regions for different parity bytes and how the parity bytes are addressed in a parity buffer according to one embodiment of the present invention.

FIG. 8A is a block diagram illustrating how the internal memory 195, when used by the ECC Encoding 700, is partitioned into three regions according to one embodiment of the present invention. Each of the two parity buffers 1 and 2 has 4832 bytes and is able to store one ECC block's parity bytes. The remaining space of the internal memory is about 5 K bytes and is either unused during ECC encoding, or is used for storing intermediate values.

FIG. 8B is a block diagram illustrating how the PI and PO bytes are addressed within each parity buffer. The address of each PI byte associated with one of the 192 user data rows in a parity buffer is: row#*10+parity#, wherein row# ranges from 0 to 191 and parity# ranges from 0 to 9. The address of each PO byte in the parity buffer is: 1920+PO#*182+parity#, wherein PO# ranges from 0 to 15 and parity# ranges from 0 to 181. Note that there are actually two distinct PI regions in FIG. 8B and the PI bytes in the PO region are addressed using the same formula as the one used for the PO bytes. It will be understood by one skilled in the art that the two formulas mentioned above are for illustrative uses only. There are many other possible addressing schemes available for identifying parity bytes in the buffer.

Figure 9A:
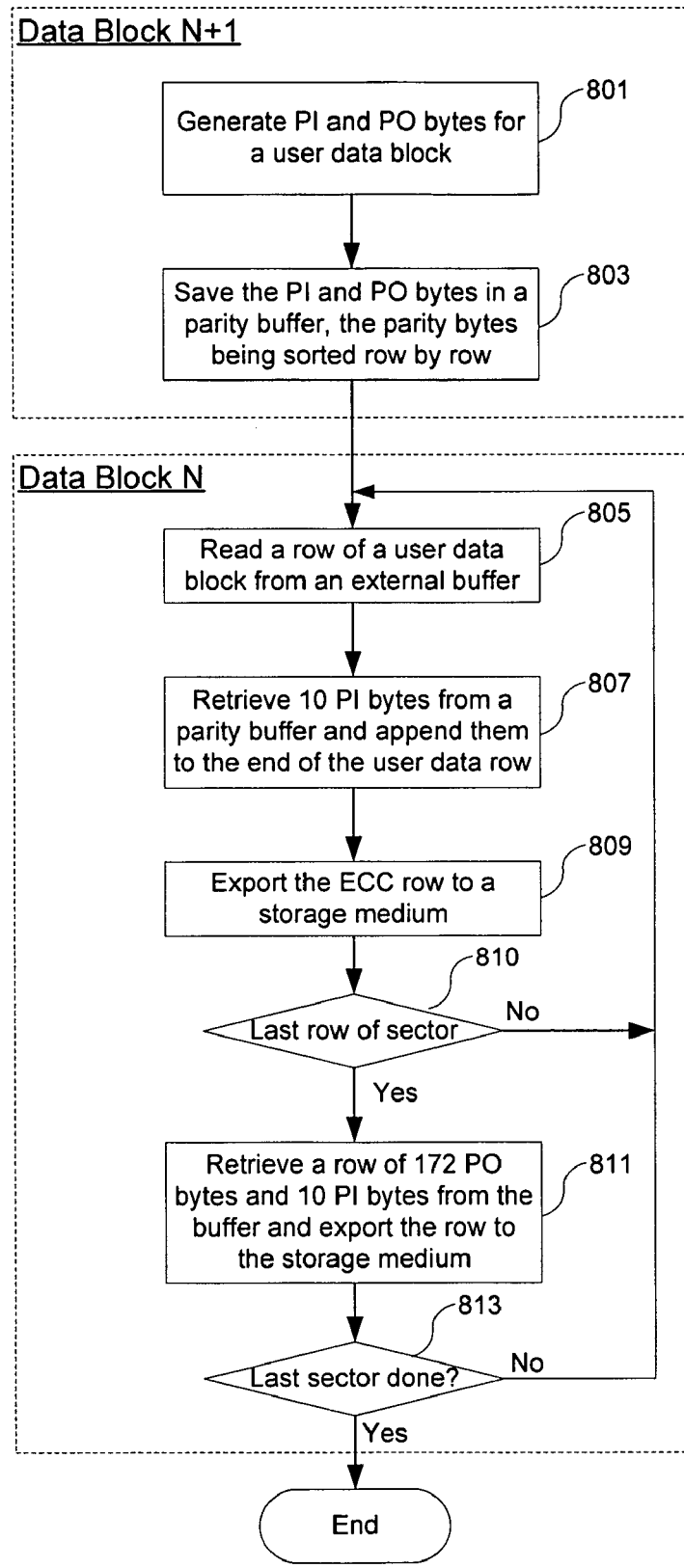
FIGS. 9A and 9B are flowcharts illustrating two embodiments of the ECC encoder.

FIG. 9A is a flowchart illustrative of how the ECC encoder processes two consecutive data blocks in a pipelined fashion. The parity computation logic generates PI and PO bytes for a data block N+1 (801) and transfers them to the parity allocation logic, which then saves each parity byte within one of the parity buffers at an address determined using the formulas discussed above (803). At the same time (i.e., during an overlapping period or time), the data write logic reads a row of 172 user data bytes from data block N in the external buffer (805), retrieves from the other parity buffer 10 PI bytes using the PI address formula, appends the 10 PI bytes to the end of the 172 user data bytes (807) and exports the 182 bytes to the DVD as an ECC row (809). Since the PO bytes are interleaved with the user data row in the DVD, after the last (i.e., twelfth) data row of a sector has been written to the DVD (810-Yes), the data write logic retrieves a row of 172 PO bytes and 10 PI bytes from the parity buffer and transmits the row for recording in the DVD (811). This process continues until the last sector of the ECC block has been transmitted for recording in the DVD.

Figure 9B:
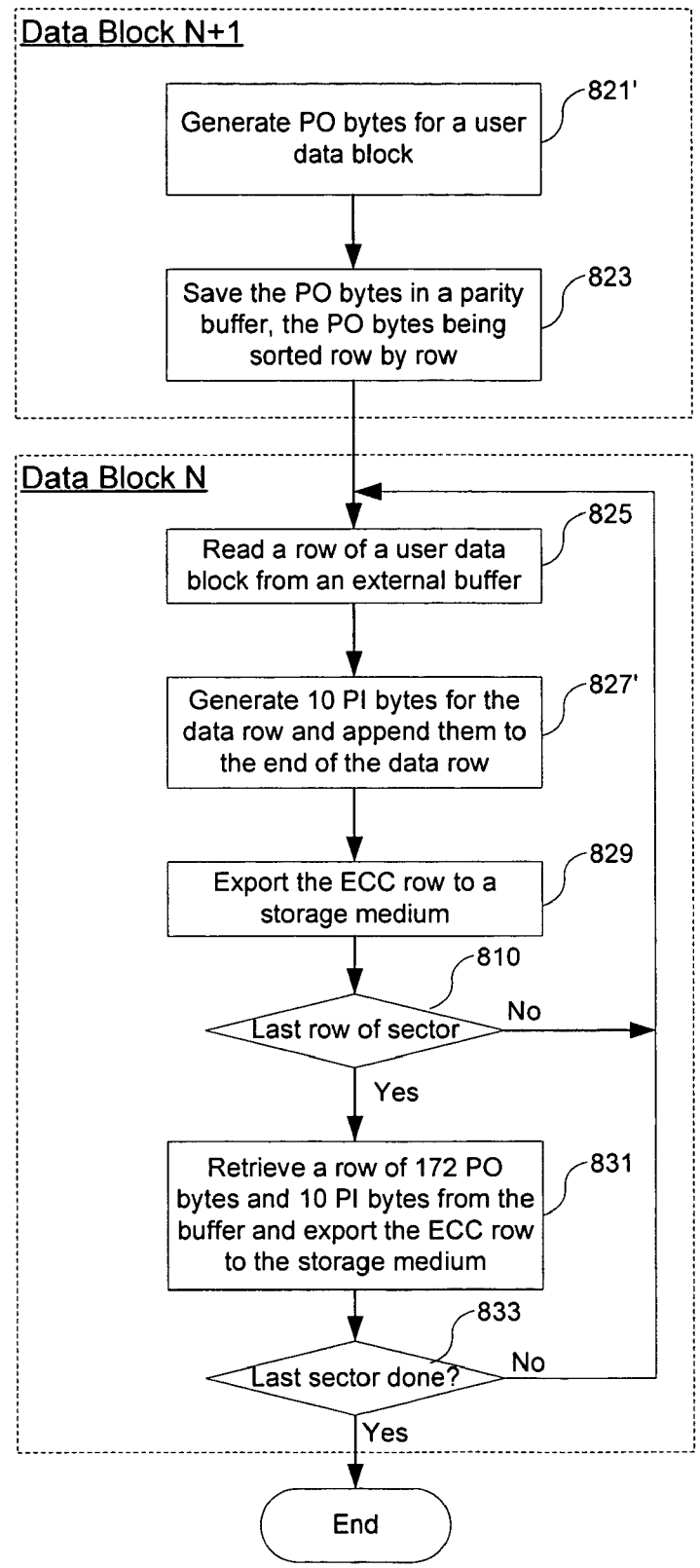

FIG. 9B illustrates an alternative embodiment of the ECC encoding process. The only differences between this embodiment and the one shown in FIG. 9A are that only the 16 rows of PO bytes and the PI bytes for those 16 rows are cached in the internal memory at 821, and the 10 PI bytes associated with each data row are generated on the fly at 827'. In yet another embodiment, only 16 rows of 172 PO bytes are saved in the parity buffer. After exporting the last data row of an ECC sector at 810, the ECC encoder identifies a row of 172 PO bytes in the parity buffer, generates 10 PI bytes for the PO bytes on the fly and then exports the row of parity bytes to the storage medium. In these embodiments, the data write logic 740 (FIG. 7) needs to include logic for dynamically generating the PI bytes for either the data rows, or both the data rows and the PO rows (depending on which alternately embodiment is being used), while the data block is being transferred to the back end device.

It will be understood by one skilled in the art that it is possible to allocate one or more parity buffers in the unused space since the memory access is much faster than DVD writing. For example, if both PI and PO bytes are stored in the internal memory, it is possible for the ECC encoder to generate two subsequent blocks' parity bytes while exporting one ECC block. If only PO bytes are stored in the internal memory, it is possible for the ECC encoder to generate four subsequent blocks' PO bytes (that occupy 11008 bytes in the memory) while exporting one ECC block.

It is also apparent to one skilled in the art that the DVD-based embodiments discussed above is only for illustrative purposes. However, the use of these exemplary embodiments should not be construed in any respect as a limitation to the application of the present invention. Each occurrence of the term "DVD" may be substituted by a more general term like "massive storage device" that may include, but not limited to, any type of optical disk or disks (like Blu-ray disks, HD-DVD, CDs, Magneto Optical (MO) disks and mini disks, etc.), flash ROM, hard disk, NAS array, or the like.

Although some of various drawings illustrate a number of logical stages in a particular order, stages which are not order dependent may be reordered and other stages may be combined or broken out. While some reordering or other groupings are specifically mentioned, others will be obvious to one skilled in the art and so do not present an exhaustive list of alternatives. Moreover, it should be recognized that the stages could be implemented in hardware, firmware, software or any combination thereof.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

What is claimed is:

1. A method of efficiently utilizing a memory device, comprising:
   determining a set of operations to be performed on a data block stored in the memory device, wherein the data block includes multiple rows and columns of data values;
   sorting the operations into an order so as to minimize a number of accesses to the memory device to perform the operations; and
   performing the sorted operations in said order, wherein the performing includes accessing each data value in the data block no more than once.

2. The method of claim 1, wherein the sorting sorts the operations into groups of operations, each group corresponding to at least one respective row of data in the memory device.

3. The method of claim 1, wherein the operations are error correction operations on the data values.

4. The method of claim 1, including transferring the data block from an optical disk to the memory device prior to the determining.

5. The method of claim 1, including transferring the data block from a massive storage device to the memory device prior to the determining.

6. An apparatus, comprising:
   processing logic for determining a set of operations to be performed on a data block stored in a memory device, wherein the data block includes multiple rows and columns of data values;
   sorting logic for sorting data representing the set of operation into an order so as to minimize a number of accesses to the memory device to perform the operations; and
   applying logic for performing the operations in accordance with the order of said sorted data, wherein the performing includes accessing each data value in the data block no more than once.

7. The apparatus of claim 6, wherein the memory device is a device selected from the group consisting of any type of DRAM or SRAM memory device.

8. The apparatus of claim 6, wherein the apparatus includes an optical disk reader and logic for transferring said data block from an optical disk in the optical disk reader to the memory device.

9. The apparatus of claim 6, wherein the apparatus includes logic for transferring said data block from a massive storage device to the memory device.

10. The apparatus of claim 6, wherein the processing logic generates error correction values for correcting errors in the data block stored in the memory device, and the applying logic corrects errors in the data block stored in the memory device using the generated error correction values.

11. The apparatus of claim 10, wherein the sorting logic sorts the generated error correction values in accordance with a predefined order in which the data block stored in the memory device is to be transferred to another device.

12. A method of processing a data block stored in a memory device, wherein the data block includes multiple rows and columns of data values, the method comprising:
  generating information associated with the data block;
  sorting the information into multiple sets, each set corresponding to a continuous portion of the data block; and
  applying each set of information to a corresponding portion of the data block, wherein the applying includes accessing each data value in the data block no more than once.

13. The method of claim 12, wherein
  the data block comprises a first data block; and
  the method includes computing a plurality of syndromes and generating error correction data for a second data block while correcting errors in the first data block.

14. The method of claim 12, wherein said generating and sorting and applying further include:
  computing a respective set of PO bytes for each column of the data block;
  sorting the PO bytes associated with different columns of the data block into a plurality of rows of PO bytes;
  computing a respective set of PI bytes for each row of the data block;
  appending to each row of the data block its associated PI bytes; and
  interleaving one of the plurality of rows of sorted PO bytes with the data block in a predefined order.

15. The method of claim 14, wherein the data block includes a plurality of sectors, each sector having a predetermined number of rows, and the predefined order includes appending to each sector one of the plurality of rows of sorted PO bytes.

16. The method of claim 14, wherein said appending further includes:
  computing a respective set of PI bytes for each of the plurality rows of PO bytes; and
  appending to each of the plurality of rows of PO bytes its associated set of PI bytes.

17. The method of claim 12, wherein the data block comprises a first data block and said generating and sorting and applying further include:
  computing a respective set of PO bytes for each column of the first data block;
  sorting the PO bytes associated with different columns of the first data block into a plurality of rows of PO bytes;
  computing a respective set of PI bytes for each row of a second data block;
  appending to each row of the second data block its associated PI bytes; and
  interleaving previously computed rows of sorted PO bytes with the second data block in a predefined order.

18. A method of processing a data block stored in a memory device, comprising:
  generating information associated with the data block;
  computing a plurality of syndromes for the data block;
  sorting the information into multiple sets, each set corresponding to a continuous portion of the data block; and
  applying each set of information to a corresponding portion of the data block;
    wherein said generating and sorting further include:
      identifying a non-zero syndrome associated with a row or column of the data block;
      computing a plurality of error correction tuples according to the identified syndrome, each tuple including a column identifier and an error correction value, each tuple further having an associated row identifier; and
      associating each error correction tuple with one of the multiple sets according to its respective row identifier such that the error correction tuples within each set share a row identifier.

19. The method of claim 18, wherein the continuous portion of the data block comprises a row of data values in the data block.

20. The method of claim 19, wherein the applying further includes:
  identifying a row identifier associated with a set of error correction tuples;
  retrieving from the memory device a row of data values in the data block that correspond to the row identifier;
  updating the retrieved data values according to the column identifiers and error correction values in the set of error correction tuples;
  performing a predefined operation using the updated row of data values; and
  repeating said identifying, retrieving, updating and writing until each of the multiple sets has been visited at least once.

21. The method of claim 20, wherein the updating further includes:
  selecting a tuple in the set of error correction tuples;
  identifying a data value in the row according to the column identifier of the selected tuple;
  updating the data value using the error correction value of the selected tuple; and
  repeating said selecting, identifying and updating until every tuple in the set has been selected.

22. The method of claim 21, wherein updating the data value comprises XORing the identified data value with the error correction value.

23. An apparatus, comprising:
  a buffer;
  processing logic for generating information associated with a data block stored in a memory device, wherein the data block includes a plurality of data values that are organized into multiple rows and columns;
  sorting logic for sorting the information generated by the processing logic into multiple sets, each set corresponding to a continuous portion of the data block, including at least one row of the data block, and allocating at least one distinct location in the buffer for each set; and
  applying logic for applying each set of information to a corresponding portion of the data block, wherein the applying includes accessing each data value in the data block no more than once.

24. An apparatus, comprising:
  a buffer;
  processing logic to generate information associated with a data block stored in a memory device;
  sorting logic to sort the information generated by the processing logic into multiple sets, each set corresponding to a continuous portion of the data block, and allocating at least one distinct location in the buffer for each set; and
  applying logic to apply each set of information to a corresponding portion of the data block, wherein said processing, sorting and applying logic include:
  error correction computation logic coupled to the buffer, the error correction computation logic generating error correction data for a plurality of errors identified in the data block;
  error correction storage logic coupled to the buffer, the error correction storage logic storing the error correction data in different sections of the buffer, each buffer section storing error correction data corresponding to errors identified within a continuous region of a data block; and data value correction logic coupled to the buffer, the data value correction logic correcting errors within a respective continuous region of a data block using the error correction data stored in a corresponding section of the buffer.

25. The apparatus of claim 24, wherein the error correction data includes one or more error correction tuples, each tuple including a row identifier, a column identifier and an error correction value.

26. The apparatus of claim 25, wherein sections of the buffer comprise a plurality of lines of error correction tuples, each line hosting at most N error correction tuples that share a row identifier;

the error correction storage logic stores error correction tuples sharing a row identifier in a plurality of lines in the buffer when the number of correction tuples sharing the row identifier is more than N; and the plurality of lines form a linked list in the buffer, with a last allocated line of the plurality of lines including a pointer to a next to last allocated line of the plurality of lines.

27. An apparatus, comprising:

a buffer including first and second index tables, entries in the first index table pointing to a plurality of lines of error correction tuples associated with a first data block and entries in the second index table pointing to a plurality of lines of error correction tuples associated with a second data block;

processing logic to generate information associated with a data block stored in a memory device;

sorting logic to sort the information generated by the processing logic into multiple sets, each set corresponding to a continuous portion of the data block, and allocating at least one distinct location in the buffer for each set; and applying logic to apply each set of information to a corresponding portion of the data block.

28. The apparatus of claim 27, further including control logic for controlling the data value correction logic to process the first data block while controlling the syndrome computation logic to process the second data block.

29. An apparatus, comprising:

a buffer including at least two linked lists, a first linked list comprising a first plurality of lines reserved for allocating error correction data associated with the data block and a second linked list comprising a second plurality of free lines available for allocating more error correction data;

processing logic to generate information associated with a data block stored in a memory device;

sorting logic to sort the information generated by the processing logic into multiple sets, each set corresponding to a continuous portion of the data block, and allocating at least one distinct location in the buffer for each set; and applying logic to apply each set of information to a corresponding portion of the data block.

30. An apparatus, comprising:

a buffer;

processing logic to generate information associated with a data block stored in a memory device;

sorting logic to sort the information generated by the processing logic into multiple sets, each set corresponding to a continuous portion of the data block, and allocating at least one distinct location in the buffer for each set; and applying logic to apply each set of information to a corresponding portion of the data block;

wherein said processing, sorting and applying logic include:

parity computation logic coupled to the buffer, the parity computation logic generating parity bytes for the data block;

parity allocation logic coupled to the buffer, the parity allocation logic allocating the parity bytes in the buffer in a predefined order; and data write logic coupled to the buffer, the data write logic generates an ECC block by interleaving the parity bytes with the data block.

31. The apparatus of claim 30, wherein the data block includes multiple rows and columns of data values, and the parity computation logic generates a set of PI bytes for each row of the data block and a set of PO bytes for each column of the data block.

32. The apparatus of claim 31, wherein the parity allocation logic allocates in the buffer the multiple sets of PI bytes row by row and sorts the multiple sets of PO bytes into multiple rows, each row having an associated set of PI bytes.

33. The apparatus of claim 32, wherein, for each row of the data block, the data write logic retrieves from the buffer a set of PT bytes and appends the PI bytes to the row of the data block, and after processing a predetermined number of rows of the data block, the data write logic retrieves from the buffer a row of sorted PO bytes and its associated set of PI bytes and inserted into the ECC block the row of sorted PO bytes and its associated set of PI bytes.

34. The apparatus of claim 30, wherein the data block processed by the data write logic is different from the data block processed by the parity computation logic and the parity allocation logic.

35. The apparatus of claim 30, wherein the buffer includes at least two linked lists, a first linked list comprising a first plurality of lines reserved for allocating parity bytes associated with the data block and a second linked list comprising a second plurality of free lines available for allocating more parity bytes.

* * * * *